United States Patent [19]

Tilton et al.

[11] Patent Number: 5,719,444
[45] Date of Patent: Feb. 17, 1998

[54] PACKAGING AND COOLING SYSTEM FOR POWER SEMI-CONDUCTOR

[76] Inventors: Charles L. Tilton; Donald E. Tilton; Bruce A. Smetana, all of P.O. Box 69, Colton, Wash. 99113-0069

[21] Appl. No.: 638,985

[22] Filed: Apr. 26, 1996

[51] Int. Cl.$^6$ .................. H01L 23/34; H02B 1/00; H01R 63/68
[52] U.S. Cl. .................. 257/714; 257/717; 257/712; 361/676; 361/688
[58] Field of Search .................. 257/714, 718, 257/719, 722, 723, 796, 675; 361/676, 704, 709, 688

[56] References Cited

U.S. PATENT DOCUMENTS

| | | | |
|---|---|---|---|
| 3,746,947 | 7/1973 | Yamamoto et al. | 317/234 |
| 4,392,153 | 7/1983 | Glascock, II et al. | 257/714 |
| 4,573,067 | 2/1986 | Tuckerman et al. | 257/722 |
| 4,825,284 | 4/1989 | Soga et al. | 257/722 |
| 4,982,267 | 1/1991 | Mones et al. | 257/706 |
| 5,049,973 | 9/1991 | Satrianc et al. | 257/675 |
| 5,102,829 | 4/1992 | Cohn | 437/217 |
| 5,237,203 | 8/1993 | Massaron | 257/688 |
| 5,239,200 | 8/1993 | Messina et al. | 257/714 |
| 5,291,064 | 3/1994 | Kurokawa | 257/714 |
| 5,323,292 | 6/1994 | Brezzinski | 361/689 |
| 5,345,107 | 9/1994 | Daikoku et al. | 257/717 |
| 5,373,417 | 12/1994 | Barrett | 361/699 |
| 5,388,635 | 2/1995 | Gruber et al. | 165/80.4 |

FOREIGN PATENT DOCUMENTS

| | | | |
|---|---|---|---|
| 4-147656 | 5/1992 | Japan | 257/714 |
| 4-147657 | 5/1992 | Japan | 257/714 |
| 5-95064 | 4/1993 | Japan | 257/714 |
| 5-235227 | 9/1993 | Japan | 257/714 |

*Primary Examiner*—Mahshid D. Saadat
*Assistant Examiner*—Jhihan B. Clark
*Attorney, Agent, or Firm*—Keith S. Bergman

[57] ABSTRACT

A packaging and cooling system for one or more semi-conductor devices provides a casement defining a die chamber carrying a peripherally positioned power board with pre-attached multi-functional power pins communicating to medially positioned dies. The power pins provide not only improved power supply but also provide heat transfer from and mechanical support for the die. The die with an attached power supply plane and heat spreader is flip mounted on the power pins. The casement defines channels for coolant between the power board and dies and outwardly of the heat spreader. A closed cooling system provides a fluidic coolant to an input plenum from which it is sprayed into the die chamber channels for evaporative cooling therein on both sides of contained dies and about the power pins with subsequent recovery and recycling. The asymmetrical architecture within the die chamber allows less restricted thermal expansion of the various components than would result from common symmetrical architecture.

11 Claims, 2 Drawing Sheets

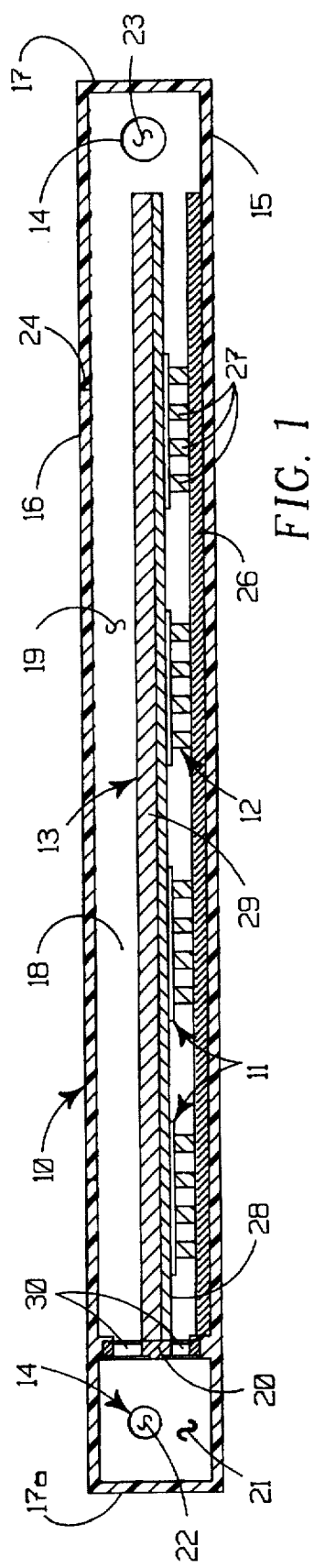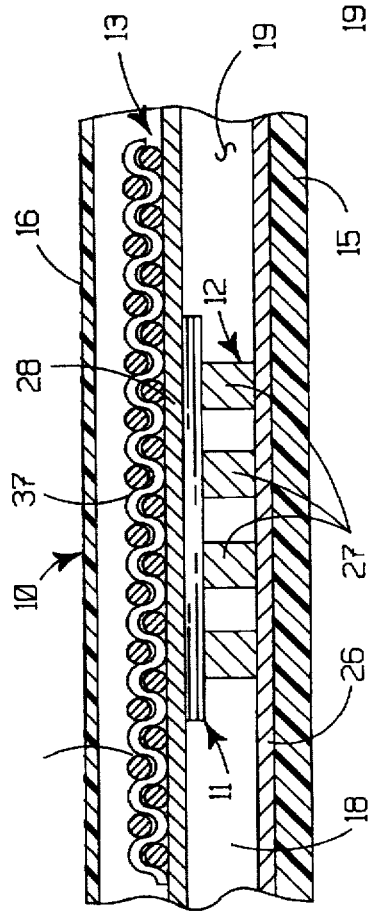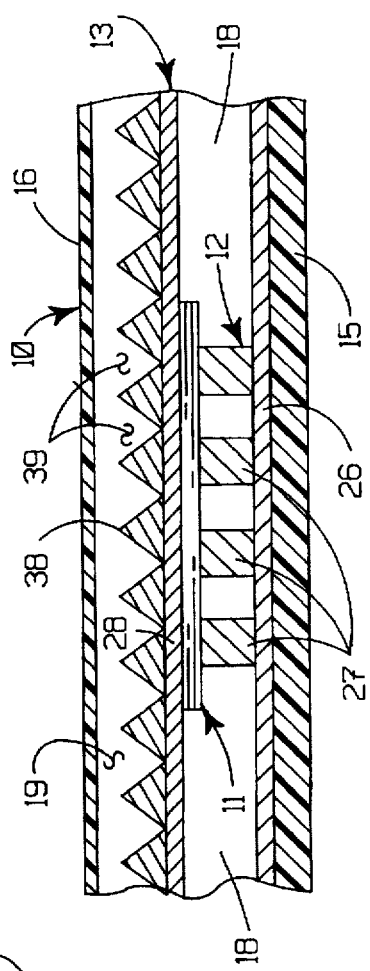

PACKAGING AND COOLING SYSTEM FOR POWER SEMI-CONDUCTOR

II. BACKGROUND OF INVENTION

IIA. Related Applications

There are no applications related hereto heretofore filed in this or any foreign country.

IIB. Field of Invention

Our invention relates generally to the packaging and cooling of active solid state electrical devices, and more particularly to packaging that generates low stress upon thermal expansion and has a closed circuit, state changing cooling system to remove heat from the package.

IIC. Background

Present day advances in active solid state semi-conductors and circuit design for them have allowed substantially increased component density in high-power semi-conductor devices. The dimensioning of transistor components and improved manufacturing techniques over the past two decades have increased the number of circuits that may be embodied in a semi-conductor by several orders of magnitude. Transistor size reductions have allowed a decrease in the power consumption of individual circuits, but the increase in the number of circuits per chip has increased the total power consumption of the chip to more than offset any power diminishment in the individual circuits. Additionally, during the same developmental period, the failure of semi-conductors has significantly decreased and packaging failures of such devices have come to be the principal factor determining system reliability. These historical developments tend to indicate that with further advances the management of electrical, thermal and mechanical parameters, and particularly the input of electrical power to the chip and dissipation of thermal energy from it, will be significant if not determinative factors for the future development of the art.

The conventional packaging and design methods of the present day, if continued, will reduce the gains achievable by advanced chips that are now commercially seen or will be seen in the near future. The successful design of future chip packaging involves the selection of technologies from various alternatives and the addition of improvements in the packaging system to provide optimization of desirable features. The present invention is a result of such an approach involving particularly thermal management, electrical power transmission and mechanical support.

The technique and material used to connect and support a chip on a substrate must provide an electrical function, a structural function and commonly a thermal management function. Wire bonding comprising ultrasonic or thermosonic bonding with gold, aluminum alloy, silver and copper wires is the most common technique for creating topside electrical contacts. Chip packaging structure normally, however, must not only provide electrical interconnections, but also must physically support the die and establish a path for heat removal. Most severe mechanical stresses in die packages result from differential dimension changes between the die and the package or its substrate caused by temperature changes in such elements that have differences in coefficients of thermal expansion. These physical changes induce stress that may result not only in dimensional changes but also in fatigue, failure of the die package or disruption of its inter-relationship with contained elements. To aid removal of heat generated in the die, its packaging must generally connect the die to a lower resistance thermal path. In wire bonded chips, the heat generally flows through an eutectic solder material or an epoxy layer into a substrate or heat spreader.

The modern trends in semi-conductor technology are requiring more advanced cooling methodologies. Prior indirect cooling methods require efficient thermal transport from the semi-conductor junctions through packaging and across an interface to a heat sink of some type. If the thermal resistance through this path is too high, indirect cooling methods become inefficient and unattractive. With increase in power density and flip-chip packaging, the indirect cooling methods will become more and more limited. The more direct cooling methods of the instant invention have therefore been developed to meet future performance requirements in chip packaging and auxiliary cooling systems therefore.

IID. Prior Art

Semi-conductor devices of the type described are known in present day commerce, as are various packaging structures and configurations that embody some, but not all, of the improved structures and methods of our packaging and cooling system.

The instant structure provides power insertion pins that are multi-functional in providing not only power transmission but also substantial heat removal from and mechanical support of a serviced chip. Prior art insertion pins have been used in semi-conductor devices internally to support a wire bond and externally as a plug-in type connection such as shown in U.S. Pat. Nos. 4,982,267 and 5,102,829, but these devices provide neither the greater and more efficient heat removal function nor the mechanical support of the instant insertion pins.

The instant packaging provides channels on both sides of a die to allow direct cooling on both die sides for greater efficiency. That cooling is enhanced by the large pin surface and cross-sectional areas that allow not only simultaneous and efficient removal of heat from the die, the substrate but also from the power insertion pins. Additionally in the present packaging, there are thinner layers of material between the die and the heat spreader, which results in an improved and shorter thermal transfer path to provide greater transfer efficiency. The semi-conductor device of U.S. Pat. No. 4,573,067 provides a plurality of microscopic channels defined by fins in intimate contact with the die to provide high heat flux capabilities. This cooling method, however, is indirect and cooling is limited by thermal resistance between the heat sink and die. Additionally, the die is cooled on only one side by a system that requires complex liquid manifolding that is rigidly attached to the die to make the cost quite high. U.S. Pat. Nos. 4,392,153; 3,746,947; and 4,825,284 all similarly use indirect cooling methods with attached heat sinks, as opposed to the instant device that provides two cooling chambers in which evaporative coolant is presented in direct contact with the die, power pins and substrate.

The multiple electrode pins of the present packaging provide mechanical support for chips that results in lower stress than single or relatively few substantially larger electrode pins as have been used in the prior art. Semiconductor devices with larger electrode pins are shown in U.S. Pat. No. 3,746,947 and Nos. 4,520,384, 4,520,383 and 4,521,170 which have two main electrode plugs, but yet by reason of the size and number of the instant pins, the overall heat transfer potential is as great or greater than the heat transfer of the larger but less numerous pins, while the heat transfer surface is substantially greater.

The instant packaging provides a die that is flip bonded to the power insertion pins, rather than being bonded by conventional wire bonding methods, to create a shorter electrical and thermal path for transmission of power to and heat from the die. Prior art devices having wire bonding with correspondingly increased and less efficient electrical and thermal paths are shown in U.S. Pat. Nos. 5,049,973 and 5,102,829.

The instant package provides asymmetrical architecture that allows less restrictive expansion of the internal packaged components with consequent lower stress and no resultant component damage, but yet provides channels on both sides of the die and die power plate for circulation and direct impingement of an evaporative, boiling-type liquid coolant. Prior art devices such as U.S. Pat. Nos. 5,388,635; 5,237,203; and 5,291,064 have shown asymmetrical architecture, but do not show direct cooling on both sides of the die and power plate structures.

III. SUMMARY OF INVENTION

A packaging and cooling system for semi-conductor devices having densely packed circuits with higher overall current density per unit of area provides one or more power dies attached to a power plane carried by a heat spreader and flip mounted on a plurality of power insertion pins which are pre-attached to a power board spacedly adjacent the power die and power plane to create a channel therebetween. The power insertion pins are spacedly related to each other and formed of material having high electric and thermal conductivity. Packaging for the structure provides a peripherally defined, enclosing casement having an input plenum at one side with cooling channels, extending on both sides of the medial layer formed by dies, power plane and heat sink, which communicate to an output orifice at the opposite side. Orifices in a septum between the input plenum and cooling channels carry a plurality of spray devices which spray into the cooling channels an evaporative type liquid coolant which is removed from the output orifice, condensed, cooled and recirculated by a pump to the input plenum channel for reuse in a closed circuit.

In providing such packaging and cooling system, it is:

A principal object to provide a semi-conductor device with an array of multi-functional pins that improve power insertion to and heat transfer from a die, provide mechanical support for the die and reduce stress in the die and its associated packaging to eliminate any need for relatively expensive aluminum substrates.

A further object is to provide such a device with pins that reduce electrical path length and stray inductance and capacitance within and between the semi-conductor device circuits.

A further object is to reduce thermal expansion mismatches, reduce thermal cycling limits and provide direct cooling on both sides of a die to permit higher current carrying capability.

A still further object is to provide such a device that is of reduced cost and size, of substantially greater reliability than similar prior devices, of efficient thermal and electrical management to allow use with chips of high current density per unit area and one otherwise well adapted to the uses and purposes for which it is intended.

Other and further objects of our invention will appear from the following specification and accompanying drawings which form a part hereof. In carrying out the objects of our invention, however, it is to be remembered that its accidental features are susceptible of change in design and structural arrangement with only one preferred and practical embodiment being illustrated in the accompanying drawings as is required.

IV. BRIEF DESCRIPTION OF DRAWINGS

In the accompanying drawings which form a part hereof and wherein like numbers of reference refer to similar parts throughout:

FIG. 1 is a somewhat idealized elongate vertical cross-sectional view through a typical first species of packaging and cooling system for a semi-conductor device embodying our invention.

FIG. 2 is a partial cross-sectional view, similar to FIG. 1, showing our invention with a second species of heat spreader having a mesh matrix heat transfer surface.

FIG. 3 is a partial cross-sectional view, similar to that of FIG. 1, showing our packaging with a third species of heat spreader having a composite ridge and groove matrix transfer surface.

V. DESCRIPTION OF PREFERRED EMBODIMENT

Figure 4:
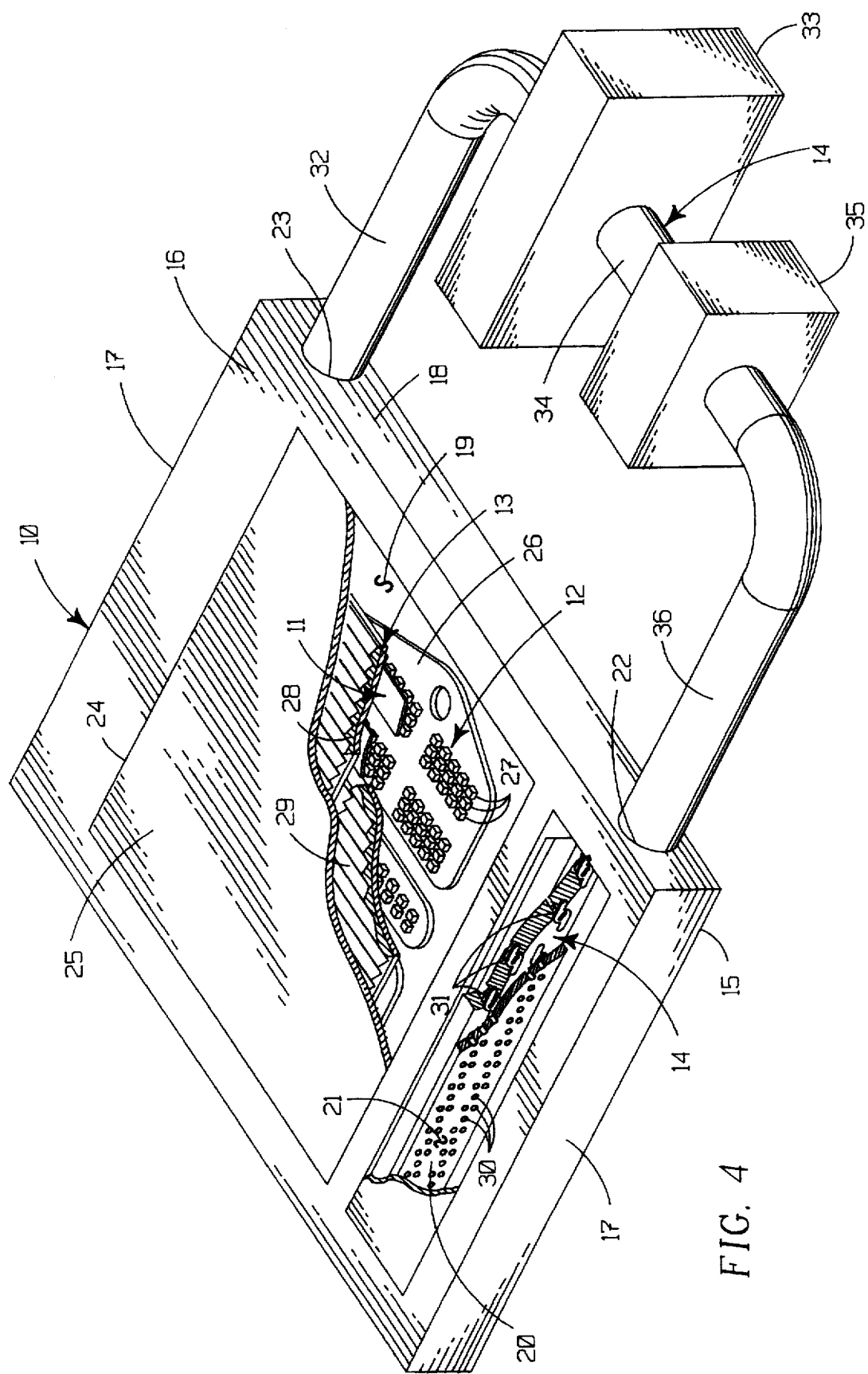
FIG. 4 is a partially cut-away, somewhat idealized isometric view of the semi-conductor device of FIG. 1 further showing various components, their configuration and relationship.

Our invention generally comprises casement 10 carrying dies 11 and heat sink 13, mounting structure 12, and cooling system 14 servicing the encased elements.

As seen in FIG. 4, casement 10 is a peripherally defined, generally rectangular parallelepiped formed by bottom panel 15, top panel 16, similar end panels 17 and similar side panels 18 all structurally interconnected at adjacent edges to define casement chamber 19. The size and configuration of the casement must be appropriately related to the components to be carried therein, but otherwise are not particularly critical and may vary as required for particular uses. The casement may be formed from various rigid materials, but the material of preference is one of the more dense resinous or polymeric plastics.

Input septum 20 extends vertically between bottom 15 and top 16 and laterally between sides 18 substantially parallel to the adjacent casement end to define input plenum 21. For ease of manufacture and use, it may be desirable that the input septum 20 be structurally separate and fastenably maintained in and on the casement, but this construction is not necessary and the input septum may be formed as a unitary part of the casement. The input septum defines a plurality of spacedly arrayed spray nozzle orifices 30 communicating therethrough each to carry a spray nozzle 31 for spray type dispersement of fluidic material from plenum 21 into the casement chamber 19.

One casement side 18 defines cooling liquid input orifice 22 communicating through that side and into input plenum 21 near input end 17a of the casement. The same or other casement side defines output orifice 23 spaced inwardly from the opposed output end to provide access for a cooling liquid through the casement to the cooling system element's exterior of the casement chamber. Top 16 normally provides access orifice 24 which is covered by access panel 25 during the manufacturing process to allow access to the casement for manufacturing. The access panel 25 is normally mechanically joined to top 16 by adhesion or thermal welding, though it may be releasably joined by mechanical fasteners (not shown) if desired.

Mounting structure 12 provides flat sheet-like power plane 26 carried on the upper surface of bottom 15 of the casement. The power plane 26 embodies known circuitry for such devices and communicates externally of casement 10 for interconnection with external electrical circuitry by means of conductors projecting through the casement (not shown) or projection of the power plane beyond the casement periphery (not shown). This interconnection structure of the power plane to electrical circuitry exterior of the casement is no different than such interconnections that have heretofore become known and therefore is not illustrated in detail.

Power plane 26 structurally carries vertically upwardly extending power insertion pins 27, spaced and configured to support and intercommunicate electrically and thermally with particular power dies to be serviced. The power insertion pins of our invention are generally areally larger than wire-like structures serving a similar purpose in the prior art but are shorter in length to maximize the functional interrelationship of power transfer to a serviced die and heat transfer away from that die. The size and length of the power pins are critically related to low stress attachment of a die supported by the power pins and must be adjusted to minimize attachment stress. The cross-sectional shape of the power insertion pins is not critical but the cross-sectional area and length are critical and must be maximized by known engineering methods to most efficiently provide electrical power to and remove heat from the serviced die. The power pin length must also be such as to create a channel of some thickness between the adjacent surfaces of the power plane and the dies to be serviced so that coolant may be efficiently circulated in that channel for heat removal.

The number and array of power insertion pins generally will be dictated by the nature of the dies being serviced, but if necessary for heat transfer, additional pins not required for power transmittal may be used. The power insertion pins are formed of a material of low electrical resistance to transmit electrical energy with a minimum of resistance generated heat, and they must also have a relatively high thermal transmissibility so as to efficiently remove heat from an associated die. The material of preference, if compatible with economic requirements, is copper, though other materials having similar electrical and thermal properties may serve the purposes of our invention and are included within its ambit and scope. Especially included are other metallic materials that have heretofore been used in the prior art for similar purposes, such as aluminum or alloys thereof.

Die 11 is of the ordinary type of such structures presently available in modern commerce and is not a part of our invention per se, but rather our invention has been created to service such a die and is governed to some degree by the nature of the die. Our packaging structure and cooling system may be used with a single die or more commonly with multiple dies in a single casement as illustrated, and it is effective in either configuration so both are included within its ambit and scope. Normally most power dies of modern types are somewhat flat, plate-like devices with connection ports on the two areally larger opposed surfaces, as in the case illustrated in FIG. 1, though our invention is operative with dies having connection ports elsewhere with appropriate modification of the interconnecting structures, which is well within the knowledge of a reasonably skilled designer in the art.

Upper heat sink 13 provides flat, sheet-like power plane 28 carried on the surface of power dies 11 distal from the power insertion pins and interconnected with those dies for appropriate electrical service, if required. The power plane may communicate electrically without casement 10 by connectors extending through the casement (not shown) or by extension of a portion of the power plane 28 itself (not shown) to communicate with supported circuitry outside the casement 10 as heretofore known for such connections in the semi-conductor arts. The power plane carries on its upper surface heat spreader 29 which serves as a thermal reservoir to aid in the dissipation of heat from its surfaces and especially its exposed upper surface. In the instance illustrated in FIG. 1, the heat sink 29 is of the same elongate dimension as the power plane, but this is not necessary and the two structures may be of different dimensions and configurations. The material from which the heat sink is formed should have a reasonably high thermal transmissibility and preferably is a metal or metal complex of the type that heretofore has been used for such purposes in the cooling of semiconductor dies. The power plane, if not required for electrical interconnections, is not necessary to our invention and the heat spreader may be used and properly serve its purposes without use of a power plane structure.

With the structure specified when mounted as described, there are channels communicating from the inner surface of input septum 20 on both sides of the adjacent dies and heat sink structures to the output end of casement chamber 19. This structure in its essence is required for operation of the evaporative fluid type cooling system used in our packaging. If desired one or more voids (not shown) may be defined in the heat sink structure between dies to allow communication between channels on both sides of the heat sink structure to enhance and equalize the cooling function.

Cooling system 14 provides a plurality of spaced spray nozzle orifices 30 defined in septum 20 to communicate between input plenum 21 and casement chamber 19. Each of the orifices 30 carries a spray nozzle 31 operated by the pressure of fluid passing therethrough to create a finely divided mist of that fluid passing into the casement chamber. Various known spray nozzles will accomplish the purposes of our invention, but one of preference that has been found to be efficient in finely dividing the droplets of a fluidic coolant in a mist is the pressure swirl type spray head heretofore known and commercially available. The dimensions of the cooling channels and their input and output orifices and the size and number of spray nozzles are functionally related to heat dissipation from packaged chips. Preferably these parameters are determined to encourage thin film evaporation instead of nucleate boiling to maximize the heat dissipation.

Fluidic coolant is circulated through the casement chamber 19 in a closed circuit communicating from input plenum 21 into input plenum 22, thence through spray nozzles 33 into casement chamber 19, from whence the fluidic coolant exits the casement through output orifice 23 to be transmitted through channel 32 to cooling condenser 33 and thence through channel 34 to pressurizing pump 35 for redelivery through channel 36 to input orifice 22 for recycling. The cooling condenser 33 and pump 35 of the cooling system are of conventional design and available in the present day marketplace, though their parameters and characteristics must be appropriately related to the thermal requirements of our cooling system and the nature of coolants used in it to maximize cooling and minimize power consumption.

Various commercial fluidic coolants are operative in our cooling system, but we prefer an evaporative type of coolant that has a boiling point in the range of the average temperature of the components carried within the casement chamber, so as to obtain the thermal benefits of state change of the fluidic coolant. Additionally since the coolant is in direct contact with various electrical components of the die system, it must have a high electric insulating characteristic and high dielectric strength. We have found the "FLUORINERT" brand of electronic liquids produced by the Minnesota Mining and Manufacturing Company to be satisfactory for the purposes of our invention. These liquids are fully fluorinated with boiling points in the zero degree and to two hundred fifty-three degrees Centigrade (C.) range and pour points in the minus one hundred fifteen degree C. range. The fluids have high chemical inertness, are more thermally stable than hydrocarbons, provide liquid phase dielectric strength of about forty-five KV/0.1 inch, and their vapors are good insulators.

Species of our invention provide modified outer coolant contacting surfaces for the heat sink.

The species of heat sink of FIG. 2 provides a metallic mesh 37 that may be structurally carried as a heat sink on the outer surface of power plane 28 to provide a more intimate contact of greater surface area with the fluidic coolant or may be used along as a heat sink without a power plane if one is not required. This metallic mesh heat sink increases the efficiency of heat transfer from the chip to the fluidic coolant. Generally, the wire mesh element 37 is formed of woven metallic wires of relatively high thermal transmissibility through the mesh is not limited to this material. This species is preferred because of its low cost, strain lessening effects and high thermal transfer characteristics.

The species of heat sink of FIG. 3 provides a plurality of parallel alternating ridges 38 and grooves 39 on the outer surface of the power plane 28 to increase the effective surface area in contact with the fluidic coolant to make heat transfer from the heat sink more efficient. The material from which the ridges 38 are formed again must be of at least as great a thermal conductivity as the material of the heat sink itself to provide any substantial increase in efficiency.

These various modifications of heat transfer surfaces of the heat sink have a synergistic reaction in our invention as their effect is greater with an evaporative type coolant than are either air conduction or fluid conduction individually.

Having described our packaging and cooling system, its use and operation may be understood.

A package encasing one, or a plurality of dies as illustrated in FIG. 1, is constructed according to the foregoing specification, and the device is switched to an operative state. As this occurs, the cooling system is powered and pump 35 activated, as well as cooling condenser 33 if that element is powered. Fluidic coolant in a pressurized state is passed into input plenum 21 from whence it is dispersed as a spray by spray nozzles 31 into casement chamber 19 on both sides of the medial flip mounted die structure and adjacent power plane and heat sink. The fluidic coolant has a boiling point of somewhat less than the preferred average operating temperature of the packaged components so that as the coolant is sprayed within the casement chamber some or all of it changes to a gaseous state.

The coolant then passes toward the output end of the casement chamber distal from the input plenum and ultimately is removed through output orifice 23 from whence it passes into cooling condenser 33 where it is cooled to its fluidic state and passed to pump 35 where it is pressurized and passed through channel 36 to input orifice 22. The fluidic coolant then is recycled into the input plenum 21 for reuse and the cycle continues to maintain the die structure substantially at an average predetermined temperature.

Various parameters of the fluidic coolant and of the components of the cooling system may be varied as desired according to known engineering principles to maintain the die temperature within a desired range.

It is to be particularly noted with the structure described that with thermally caused changes in the dimension of the various elements of the mounting structure, those elements and the dies and connected heat sink structure may move relatively freely in the casement chamber to relieve much of any stress caused by dimensional change.

It is to be further noted that although the cooling system input plenum is shown and described as being at one end of our packaging casement and the output orifice is shown in a casement side near the opposite casement end, that array is not essential and other paths of input and output of coolant are within the scope of our invention. The coolant may be input from a plenum through an input septum of appropriate size located at any part of the casement so long as coolant is sprayed into the casement chamber and circulated through that chamber to an output orifice spacedly distant from the input septum.

The foregoing description of our invention is necessarily of a detailed nature so that a specific embodiment of it might be set forth as required, but it is to be understood that various modifications of detail, rearrangement and multiplication of parts might be resorted to without departing from its spirit, essence or scope.

Having thusly described our invention, what we desire to protect by Letters Patent, and

What we claim is:

1. A packaging and cooling system for a semi-conductor device, comprising in combination:

a die having first and second sides;

a heat spreader carried on the first side of the die to create a thermal transfer path from the die;

a mounting structure having a plurality of spaced power insertion pins extending substantially perpendicularly from, and in thermal and electrical contact with, the second side of the die to structurally communicate with a power board;

a casement defining a chamber containing the die, the heat spreader and the mounting structure which is supported on a casement wall defining the chamber with a first cooling channel adjacent the first side of the die, and a second cooling channel between the second side of the die and the power board and about the power insertion pins; and first means for introducing an evaporative, electrically insulative liquid coolant into the first and second cooling channels in the casement chamber and second means for removing the liquid coolant therefrom and recycling the liquid coolant for reuse.

2. The packaging and cooling system of claim 1 wherein the die and heat spreader have substantially similar coefficients of thermal expansion.

3. The packaging and cooling system of claim 1 wherein the heat spreader comprises a metallic wire mesh.

4. The packaging and cooling system of claim 1 wherein the heat spreader comprises a power plane with a surface distal from the die formed of thermally transmissible material configured with alternating grooves and ridges to increase total surface area for heat transfer.

5. The packaging and cooling system of claim 1 wherein a power plane is carried in thermally and mechanically coupled relationship between the die and the heat spreader.

6. The packaging and cooling system of claim 1 wherein the power insertion pins each comprise an elongate rectilinear parallelepiped formed of electrically and thermally conductive material.

7. The packaging and cooling system of claim 1 wherein the casement defines an input plenum communicating with the first and second cooling channels through a plurality of spaced orifices each carrying a pressure operated spray nozzle to disperse fluidic coolant into both first and second cooling channels in a spray.

8. The packaging and cooling system of claim 7 wherein the fluidic coolant has a boiling point incrementally less than the average operating temperature of the die.

9. A packaging and cooling system for semi-conductor devices, comprising in combination:

a casement defining a medial chamber and an adjacent input plenum, having an input orifice communicating exteriorly of the casement and a plurality of spaced orifices each carrying a pressure operated liquid spray nozzle communicating between the input plenum and the medial channel, and an output orifice spacedly adjacent the input plenum communicating exteriorly of casement, a first power plane carried by the casement and supported in the medial chamber on a casement surface defining the medial chamber, said power plane supporting in electrical and thermal contact a plurality of power insertion pins extending a spaced distance therefrom and into the medial chamber;

a semi-conductor die having two sides, supported in electrical and thermal contact on the first side on at least some of the plurality of power insertion pins;

a heat spreader carried on the second side of the semi-conductor die distal from the power insertion pins and in thermal contact with the semi-conductor die; and cooling means including a pressurized evaporative fluidic coolant dispersed from the input plenum into the casement chamber and removed from the output orifice of the casement chamber for recycling exteriorly of the casement chamber.

10. The semi-conductor device of claim 9 wherein the heat spreader comprises metallic wire mesh.

11. The packaging and cooling system of claim 9 having a heat spreader comprising a second power plane with a surface distal from the semi-conductor die formed by a thermally transmissible material configured with alternating ridges and grooves to increase the total surface area for heat transfer.

* * * * *